United States Patent
Cao et al.

(10) Patent No.: US 10,491,437 B2
(45) Date of Patent: Nov. 26, 2019

(54) CIRCUITS FOR AMPLITUDE DEMODULATION AND RELATED METHODS

(71) Applicant: MEDIATEK Singapore Pte. Ltd., Singapore (SG)

(72) Inventors: Junmin Cao, Singapore (SG); Hon Cheong Hor, Singapore (SG); Tieng Ying Choke, Singapore (SG)

(73) Assignee: MEDIATEK Singapore Pte. Ltd., Singapore (SG)

( * ) Notice: Subject to any disclaimer, the term of this patent is extended or adjusted under 35 U.S.C. 154(b) by 88 days.

(21) Appl. No.: 15/726,993

(22) Filed: Oct. 6, 2017

(65) Prior Publication Data
US 2018/0198653 A1 Jul. 12, 2018

Related U.S. Application Data

(60) Provisional application No. 62/444,874, filed on Jan. 11, 2017.

(51) Int. Cl.
*H04L 27/152* (2006.01)
*H04L 1/00* (2006.01)
(Continued)

(52) U.S. Cl.
CPC ............ *H04L 27/152* (2013.01); *H01P 1/18* (2013.01); *H03D 1/22* (2013.01); *H04B 5/0031* (2013.01);
(Continued)

(58) Field of Classification Search
CPC . H04L 27/152; H04L 27/3818; H04L 27/008; H04L 27/2649; H04L 27/3809;
(Continued)

(56) References Cited

U.S. PATENT DOCUMENTS 6,907,088 B1 6/2005 Nakane et al.
7,847,627 B2 12/2010 Kranabenter
(Continued)

FOREIGN PATENT DOCUMENTS

CN 105049069 A 11/2015
TW 2014-24307 A 6/2014
(Continued)

OTHER PUBLICATIONS

Lien et al., A Self-Calibrating NFC SoC with a Triple-Mode Reconfigurable PLL and a Single-Path PICC-PCD Receiver in 0.1 μm CMOS. IEEE International Solid-State Circuits Conference Feb. 11, 2014, Session 9, Digest of Technical Papers, 158-159.
(Continued)

*Primary Examiner* — Jeffrey M Shin
(74) *Attorney, Agent, or Firm* — Wolf, Greenfield & Sacks, P.C.

(57) ABSTRACT

A circuit for demodulating an input signal is described. The circuit may be configured to demodulate signals modulated with amplitude-based modulation schemes, such as amplitude shift keying (ASK). The demodulator may comprise a clock extractor configured to generate a clock signal in response to receiving an amplitude-modulated input signal, a phase shifter configured to generate a sampling signal by phase-shifting the clock signal by approximately $\pi/2$, and a sampler configured to sample the input signal in correspondence to one or more edges (such as one or more falling edges) of the sampling signal. In this way, the amplitude-modulated input signal may be sampled at its peak, or at least near its peak, thus ensuring high signal fidelity.

18 Claims, 11 Drawing Sheets

(51) Int. Cl.
| | |
|---|---|
| *H04L 27/38* | (2006.01) |
| *H04N 7/084* | (2006.01) |
| *H04L 27/26* | (2006.01) |
| *H04L 27/00* | (2006.01) |
| *H01P 1/18* | (2006.01) |
| *H04B 5/00* | (2006.01) |
| *H04L 27/06* | (2006.01) |
| *H03D 1/22* | (2006.01) |
| *H04L 7/033* | (2006.01) |

(52) U.S. Cl.
CPC ........ *H04L 1/0003* (2013.01); *H04L 27/0008* (2013.01); *H04L 27/066* (2013.01); *H04L 27/2649* (2013.01); *H04L 27/3809* (2013.01); *H04L 27/3818* (2013.01); *H04L 27/3881* (2013.01); *H04N 7/084* (2013.01); *H03D 2200/005* (2013.01); *H03D 2200/006* (2013.01); *H04L 7/0338* (2013.01)

(58) Field of Classification Search
CPC ..... H04L 27/066; H04L 27/3881; H03D 1/22; H03D 2200/005; H03D 2200/006
See application file for complete search history.

(56) References Cited

U.S. PATENT DOCUMENTS

| | | | |
|---|---|---|---|
| 7,885,359 | B2 | 2/2011 | Meltzer |
| 7,890,080 | B2 | 2/2011 | Wu et al. |
| 7,907,005 | B2 | 3/2011 | Kranabenter |
| 8,838,023 | B2 | 9/2014 | Charrat et al. |
| 8,934,836 | B2 | 1/2015 | Lefley |
| 9,124,413 | B2 | 9/2015 | Savoj |
| 9,596,003 | B2 | 3/2017 | Cho et al. |
| 2008/0252367 | A1 | 10/2008 | Pettersen et al. |
| 2009/0309652 | A1* | 12/2009 | Kranabenter ............ H03D 1/22 329/347 |
| 2011/0064165 | A1 | 3/2011 | Bae et al. |
| 2013/0321230 | A1 | 12/2013 | Merlin et al. |
| 2014/0218080 | A1 | 8/2014 | Choke et al. |
| 2016/0142113 | A1 | 5/2016 | Gaethke et al. |
| 2016/0241384 | A1 | 8/2016 | Frantzeskakis et al. |
| 2018/0006801 | A1 | 1/2018 | Hung et al. |
| 2018/0110018 | A1 | 4/2018 | Yu et al. |
| 2018/0183637 | A1 | 6/2018 | Undheim et al. |
| 2018/0198489 | A1 | 7/2018 | Leow et al. |
| 2018/0198652 | A1 | 7/2018 | Choke et al. |

FOREIGN PATENT DOCUMENTS

| | | |
|---|---|---|
| TW | 2015-34016 A | 9/2015 |
| TW | 2017-17570 A | 5/2017 |
| WO | WO 2008/093254 A1 | 8/2008 |

OTHER PUBLICATIONS

U.S. Appl. No. 15/820,211, filed Nov. 21, 2017, Choke et al.
U.S. Appl. No. 15/867,650, filed Jan. 10, 2018, Leow et al.
18150474.7, Jun. 7, 2018, Extended European Search Report.
Bo et al., Low power clock recovery circuit for passive HF RFID tag. Analog Integr Circ Sig Process. 2009;59:207-14.
Lichong et al., High-precision high-sensitivity clock recovery circuit for a mobile payment application. J of Semiconductors. May 2011;32(5):055007-1-6.
Extended Search Report dated Jun. 7, 2018 in connection with European Application No. 18150474.7.
Choke et al., "A 3.4Mbps NFC Card Emulator Supporting 40mm² Loop Antenna" 2017 IEEE Radio Frequency Integrated Circuits Symposium (RFIC), Jun. 4, 2017, pp. 244-247.

* cited by examiner

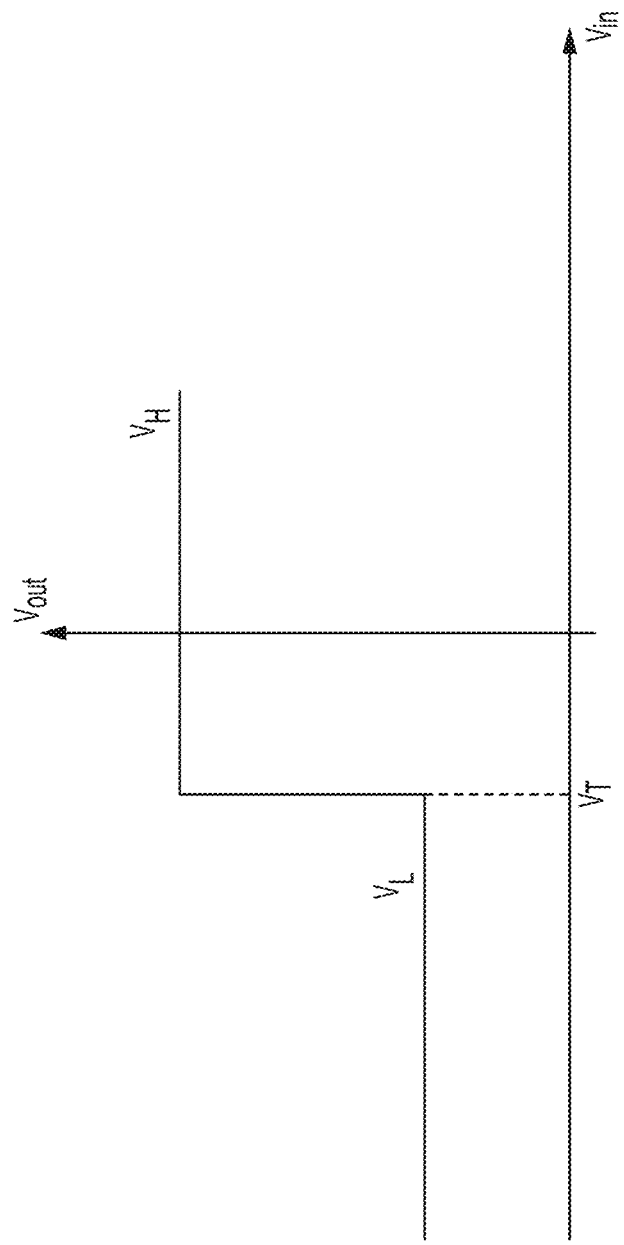

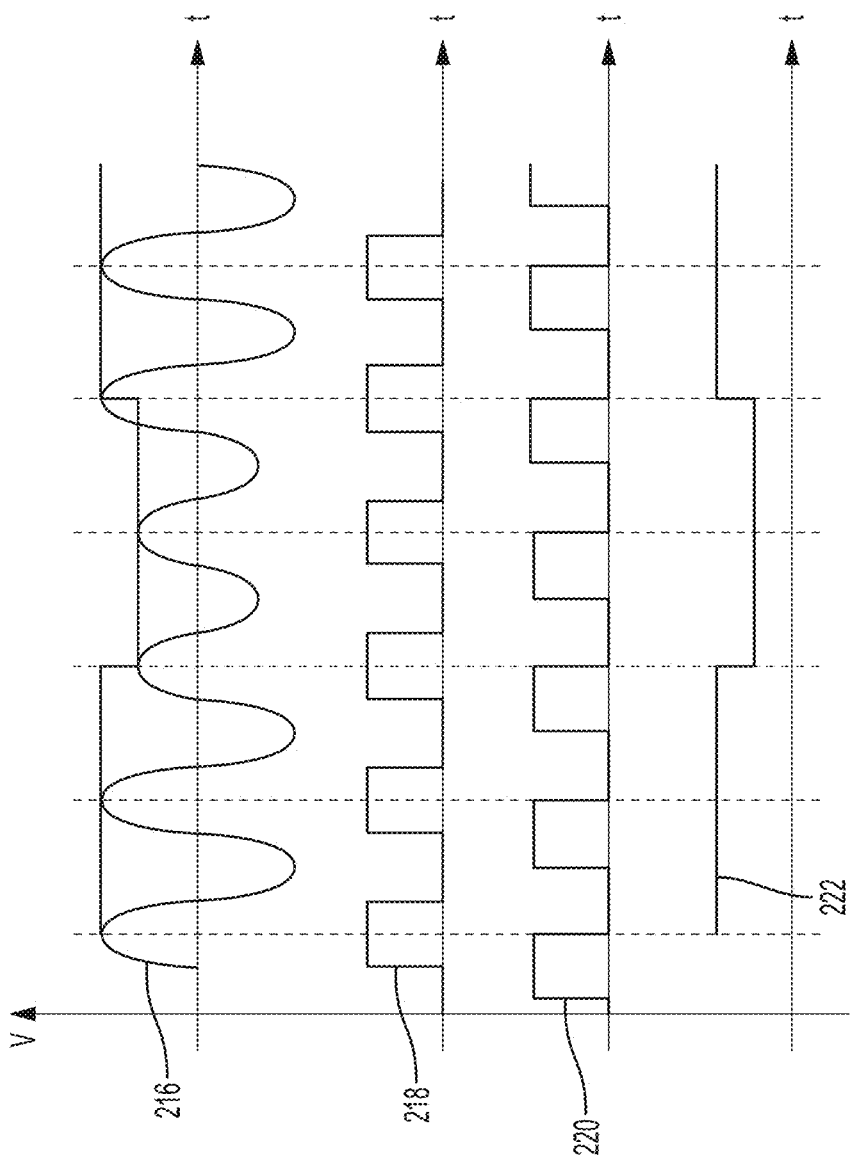

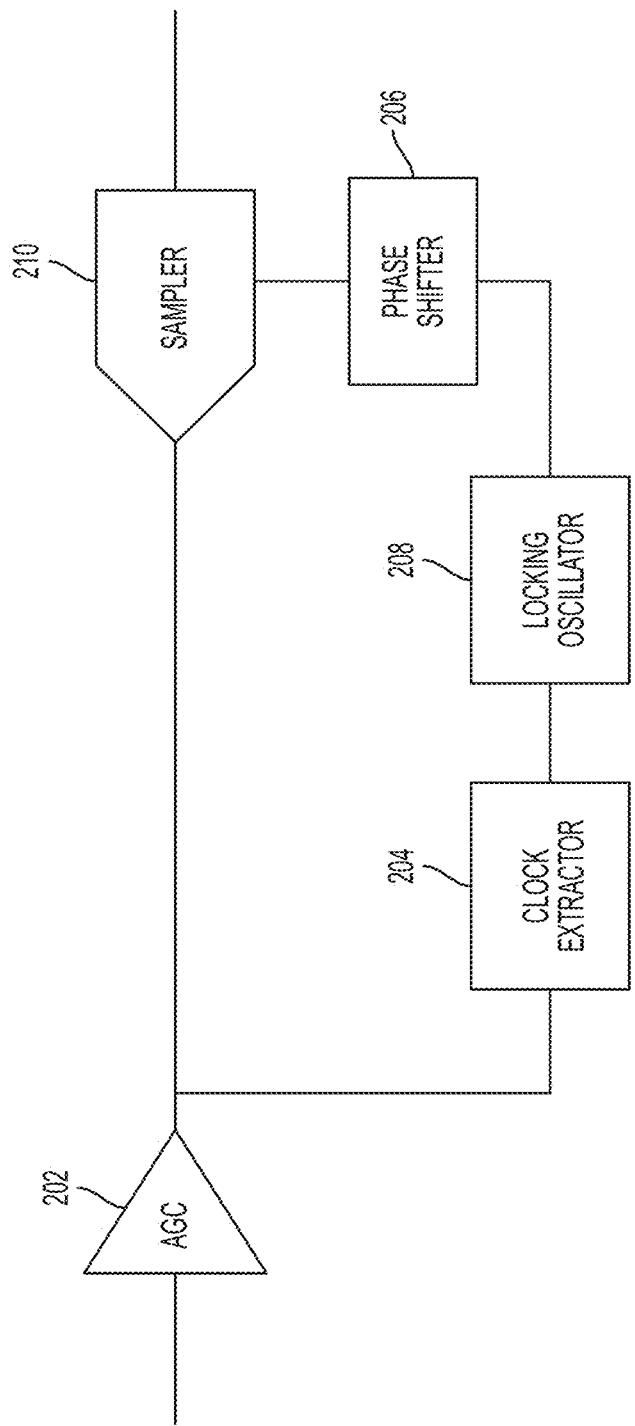

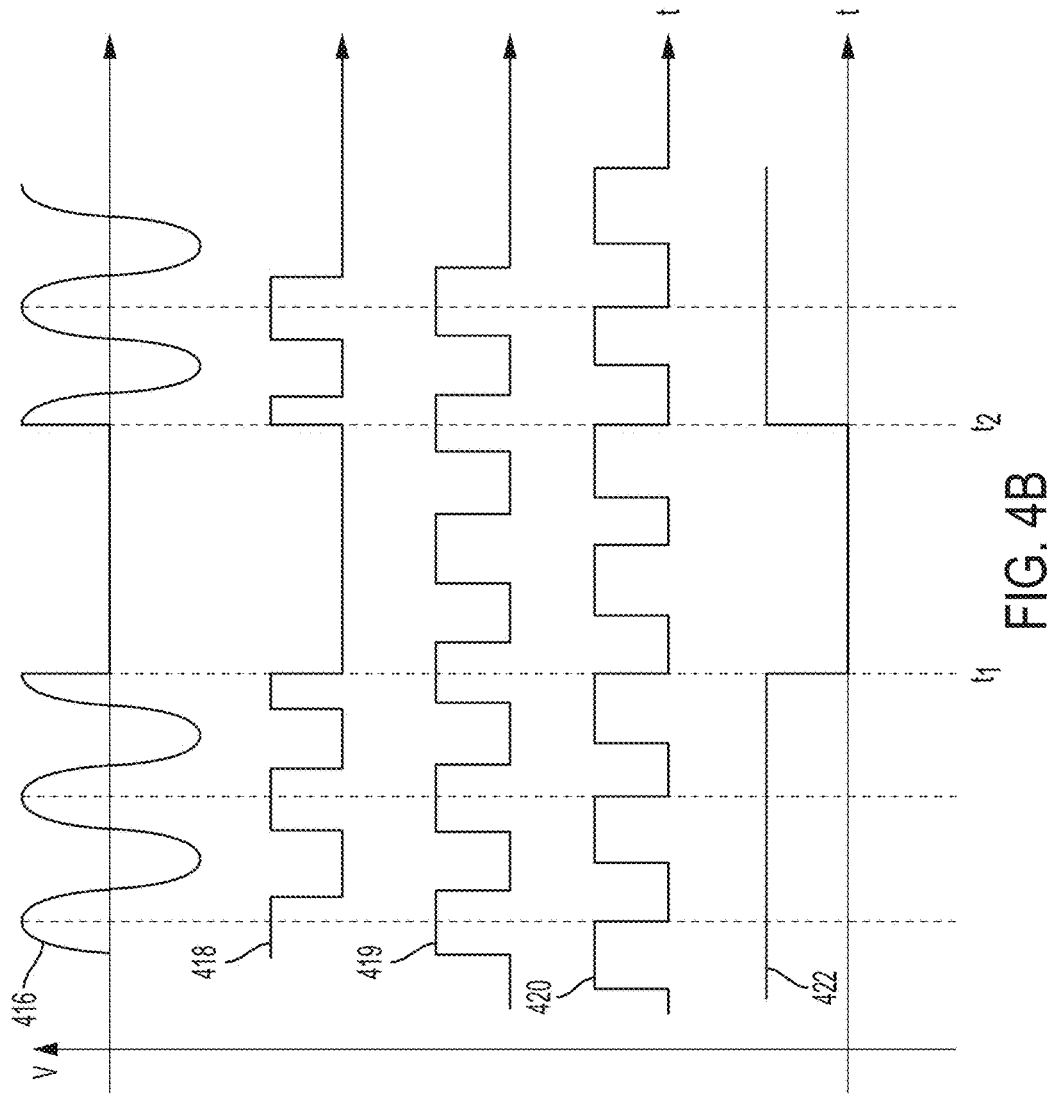

CIRCUITS FOR AMPLITUDE DEMODULATION AND RELATED METHODS

RELATED APPLICATIONS

This Application claims priority under 35 U.S.C. § 119(e) to U.S. Provisional Application Ser. No. 62/444,874, entitled "3.4 MBPS NFC CARD EMULATOR SUPPORTING 40 MM2 LOOP ANTENNA" filed on Jan. 11, 2017, which is herein incorporated by reference in its entirety.

BACKGROUND

Amplitude modulation schemes are often used in wireless communications to transmit signals between a transmitter and a receiver. An amplitude modulated signal can be generated by mixing a baseband signal with a carrier. Amplitude modulation schemes are often used in near-field communication (NFC) and in radio-frequency identification (RFID) systems.

SUMMARY

According to one aspect of the present application, an amplitude demodulator is provided. The amplitude demodulator may comprise a clock extractor configured to extract a clock signal from an input signal, a phase shifter configured to generate a sampling signal by phase-shifting the clock signal by an amount that is approximately $\pm n\pi/2$ wherein n is an odd integer, and a sampler configured to sample the input signal with a timing controlled by the sampling signal.

According to another aspect of the present application, a method for demodulating an input signal is provided. The method may comprise extracting a clock signal from an input signal, generating a sampling signal by phase-shifting the clock signal by an amount that is approximately $\pm n\pi/2$ wherein n is an odd integer, and sampling the input signal with a timing controlled by the sampling signal.

The foregoing summary is provided by way of illustration and is not intended to be limiting.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing.

FIG. 2B is a plot illustrating a representative characteristic of a clock extractor, according to some non-limiting embodiments.

FIG. 2C is a plot illustrating an input signal, a clock signal, a phase-shifted signal, and an output signal, according to some non-limiting embodiments.

FIG. 4A is a block diagram of a demodulator comprising, among other components, a locking oscillator, according to some non-limiting embodiments.

FIG. 4B is a plot illustrating a sampling signal in the presence of an input signal having a 100%-modulation depth, according to some non-limiting embodiments.

DETAILED DESCRIPTION

The inventors have developed circuits for amplitude demodulation in which distortion and non-linear effects are reduced without sacrificing power consumption. Some conventional amplitude demodulators, such as envelope demodulators that use signal rectifiers, suffer from distortion and non-linear effects. As a result, errors may arise in the signals received using these circuits. Other conventional amplitude demodulators utilize complicated calibration circuits configured to finely align the sampling circuit to the received modulated signal. Such circuits require substantial amounts of power. Consequently, their usability is significantly limited.

The circuits for amplitude demodulation developed by the inventors can exhibit low distortion and high linearity without sacrificing power consumption. Some embodiments relate to an amplitude demodulator comprising a clock extractor, a phase shifter and a sampler. The clock extractor may generate a clock signal from the received amplitude-modulated signal. The generated clock signal may have, at least in some embodiments, the same frequency as the carrier of the received modulated signal. The generated clock may then be phase shifted, for example by approximately $\pi/2$, by approximately $-\pi/2$, or by approximately $\pm n\pi/2$ where n is an odd integer. The term "approximately" is used herein with respect to phases to indicate a range that is within $\pi/8$ of a certain phase. For example, approximately $\pi/2$ indicates a range between $\pi/2-\pi/8$ and $\pi/2+\pi/8$, approximately $-\pi/2$ indicates a range between $-\pi/2-\pi/8$ and $-\pi/2+\pi/8$ and approximately $\pm n\pi/2$ indicates a range between $n\pi/2+\pi/8$ and $n\pi/2-\pi/8$ or between $-n\pi/2+\pi/8$ and $-n\pi/2-\pi/8$. The amount by which the phase of the clock signal is shifted may be so that the edges of the resulting signal align (or at least approximately align) with the peaks of the received amplitude-modulated signal. The phase-shifted clock signal may then be used to sample the amplitude-modulated signal. In this way, the amplitude-modulated signal may be sampled at its peak (or near its peak), thus enhancing the fidelity of the extracted data.

The circuits for amplitude demodulation described herein may exhibit one or more advantages relative to some conventional amplitude modulators. Non-limiting examples of such advantages are improved linearity, relaxed phase noise requirements, higher data rate and lower power consumption. Of course, other advantages that are not listed herein may arise.

Figure 1A:
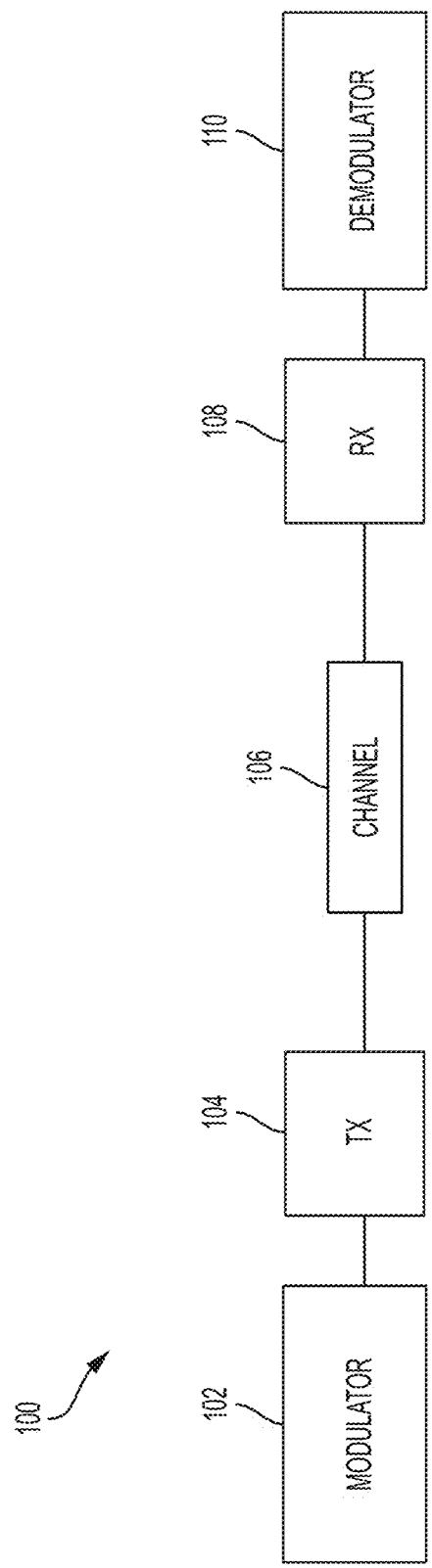
FIG. 1A is a block diagram illustrating a communication system, according to some non-limiting embodiments.

FIG. 1A is a block diagram of a representative communication system, according to some non-limiting embodiments. Communication system 100 includes a modulator 102, a transmitter (TX) 104, a channel 106, a receiver (RX)

108, and a demodulator 110. In some embodiments, modulator 102 may modulate a carrier signal with a baseband signal. The baseband signal may be encoded with binary data in some embodiments, though analog baseband signals may be used in some embodiments. The modulation scheme may be an amplitude modulation. An example of an amplitude modulation scheme that may be used at least in some embodiments is amplitude shift keying (ASK). Of course, other types of amplitude modulation schemes may be used, such as multi-level amplitude modulation schemes.

Figure 1B:
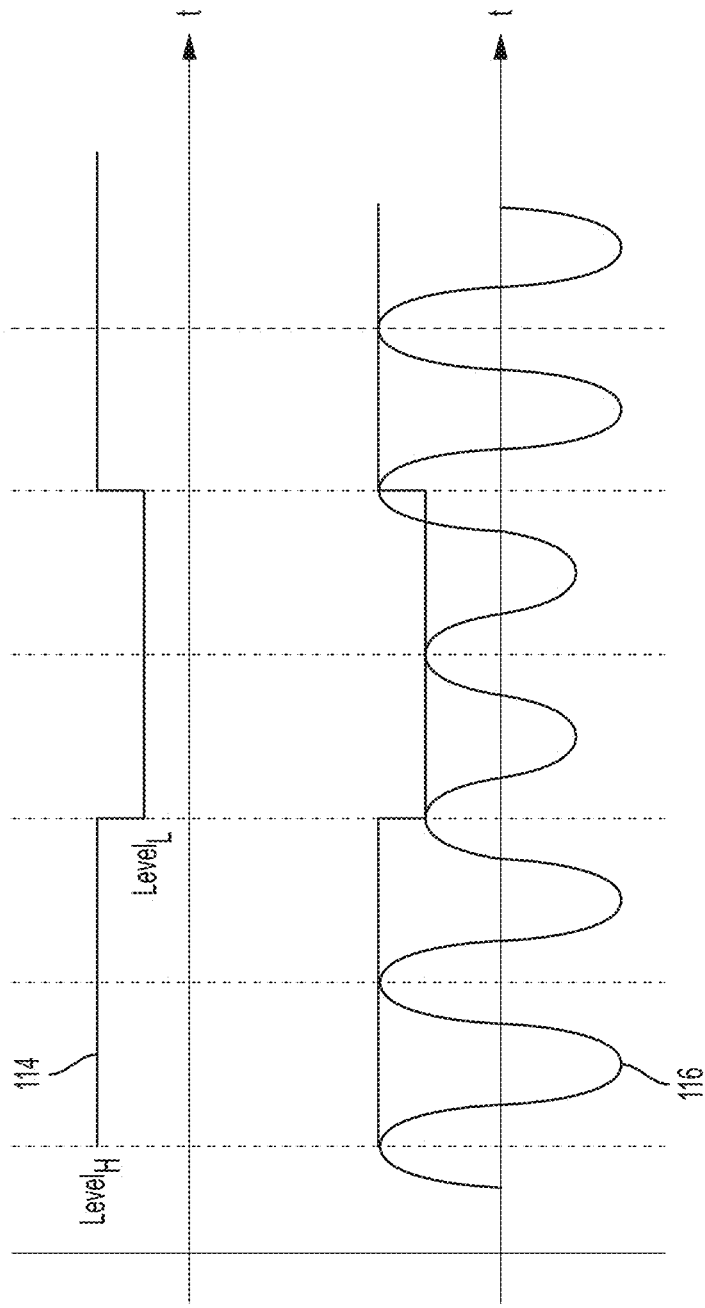
FIG. 1B is a plot illustrating a baseband signal and an amplitude-modulated signal, according to some non-limiting embodiments.

An example of a signal modulated using an amplitude modulation scheme of the type described herein is depicted in FIG. 1B. Signal 114 represents a representative baseband modulating signal. In this example, signal 114 includes two 1s (level$_H$), followed by two 0s (level$_L$), followed by two 1s again. Of course, any suitable succession of values can be applied. Amplitude-modulated signal 116 may be obtained, at least in some embodiments, by mixing signal 114 with a carrier signal. The frequency of the carrier signal may depend on different factors, including among others the type of communication protocol being used. For example, in near-field communication (NFC), the carrier signal may have a frequency of 13.56 MHz±7 KHz (e.g., a frequency that is between 13.553 MHz and 13.567 MHz), and in radio-frequency identification (RFID) systems, a frequency in an industrial, scientific and medical (ISM) radio band may be used. Examples of ISM bands that may be used in some embodiments include 6.765 MHz-6.795 MHz, 26.957 MHz-27.283 MHz, 40.66 MHz-40.7 MHz, and 902 MHz-928 MHz. Of course, any other carrier frequency may be used.

Referring back to FIG. 1A, the amplitude-modulated signal may be provided to TX 104. TX 104 may include a filter, an amplifier, and/or means for transmitting the signal through the channel 106. For example, in the embodiments in which channel 106 is a wireless channel, TX 104 may include an antenna or a magnetic coupler, such as an inductor. In other embodiments, channel 106 may include a wired channel, such as a twisted-pair cable or a coaxial cable. In these embodiments, TX 104 may include a terminal connected to an end of the cable.

Figure 1C:
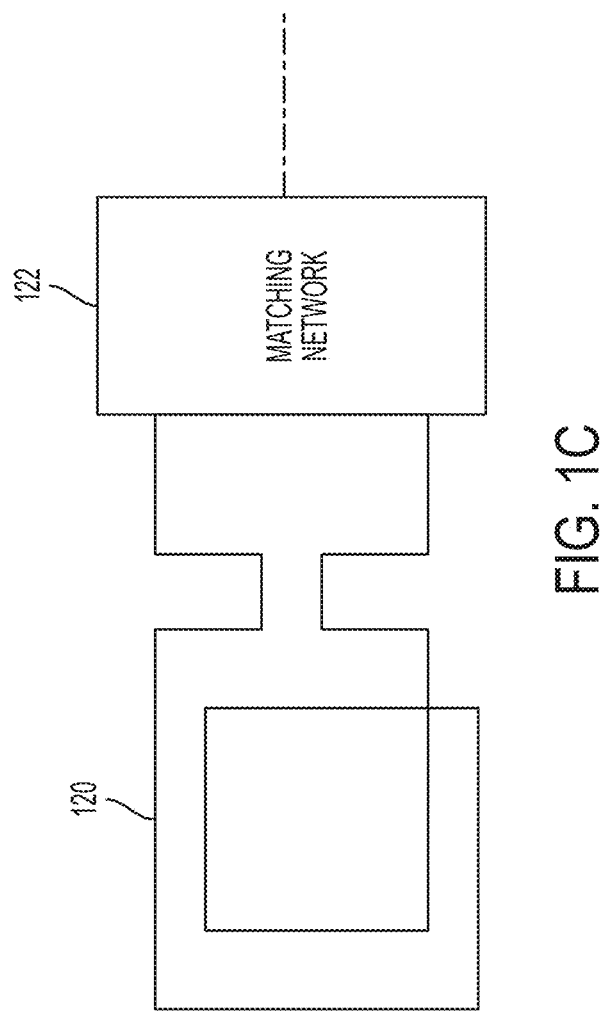
FIG. 1C is a schematic diagram illustrating a portion of a receiver including a winding and a matching network, according to some non-limiting embodiments.

Similarly, RX 108 may include antennas, inductors, or other terminals, depending on the type of channel being used. In the embodiments in which the TX and the RX are magnetically coupled, RX 108 may include one or more windings (e.g., wire loops) serving as inductor(s). An example of a winding for RX 108 is depicted in FIG. 1C. In this case, winding 120 is coupled to matching network 122, which may be configured to provide a desired resonant frequency and an antenna load for effective power transfer. The received amplitude-modulated signal may then be demodulated using demodulator 110. Following the demodulation, a baseband signal may be obtained.

Figure 2A:
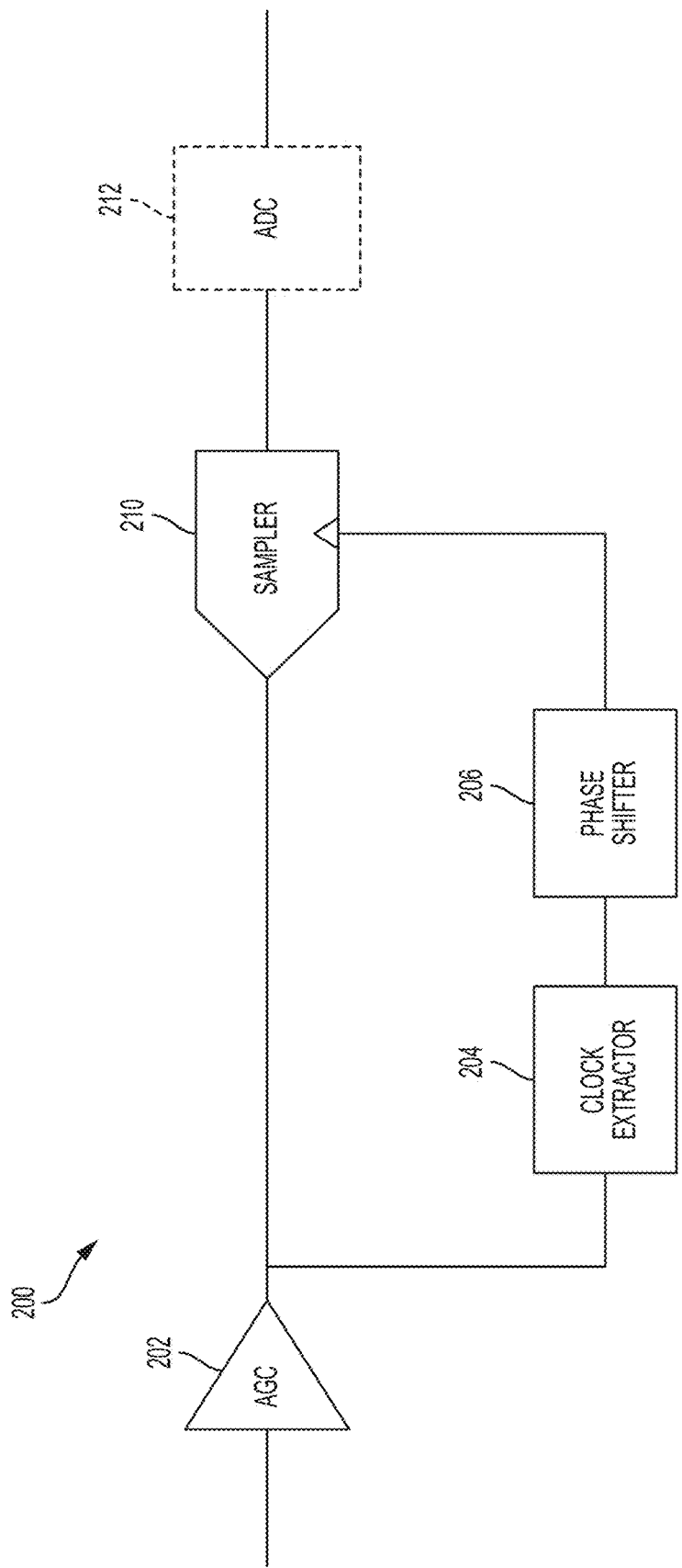
FIG. 2A is a clock diagram illustrating a demodulator, according to some non-limiting embodiments.

An example of a demodulator according to some non-limiting embodiments is depicted in FIG. 2A. Demodulator 200 may include automatic gain control (AGC) unit 202, clock extractor 204, phase shifter 206, sampler 210, and optionally analog-to-digital converter (ADC) 212. AGC 202 may ensure that the received signal is within a suitable dynamic range, such as the dynamic range of clock extractor 204 and/or sampler 210. As such, AGC 202 may include a signal amplifier, and/or an attenuator.

Clock extractor 204 may receive the amplitude-modulated signal, and may in response extract the clock from the amplitude modulated carrier signal. The clock signal may have, at least in some embodiments, the same frequency as the carrier of the modulated signal. In some embodiments, the clock extractor 204 may be implemented according to the input-output characteristic depicted in FIG. 2B. As shown, when the level of the input signal is greater than $V_T$ (which may be zero in some embodiments), the level of the output signal may be equal to $V_H$. By contrast, when the level of the input signal is less than $V_T$, the level of the output signal may be equal to $V_L$ (which may be zero in some embodiments). Of course not all embodiments need to be implemented in this manner. Circuits configured to implement the characteristic of FIG. 2B are referred to herein as "threshold circuits."

FIG. 2C is a plot illustrating the signals appearing in demodulator 200 in a specific example. Signal 216 represents the signal appearing at the input of clock extractor 204. Signal 216 may represent the amplitude-modulated signal transmitted by TX 104. Of course, the received signal need not be an exact replica of the transmitted signal, since noise or other adverse effects may be introduced along the data path (e.g., in the channel). Clock signal 218 represents the signal generated by clock extractor 204. In this example, the clock signal exhibits edges (rising and falling edges) in correspondence with the times at which the amplitude-modulated signal has a zero crossing. In other embodiments, the edges may be slightly offset relative to the zeros of signal 216. This offset may be less than 1%, less than 5%, less than 10%, or less than 15% of the periodicity of the clock signal.

Phase shifter 206 (FIG. 2A) may shift the phase of the clock signal. In some embodiments, the phase may be shifted by an amount so that the edges (e.g., the falling edges) of the resulting signal are substantially aligned (e.g., with an offset that is less than 1%, less than 5%, less than 10%, or less than 15% of the periodicity of the clock signal) with the peaks of the amplitude-modulated signal. For example, the phase of the clock signal may be shifted by approximately $\pi/2$, by approximately $-\pi/2$, or by approximately $\pm\pi/2$ where n is an odd integer.

In some embodiments, phase shifter 206 may shift the phase of the clock signal by an amount that is approximately $\pi/2$ in absolute value (e.g., the clock signal may be delayed by approximately $\pi/2$ or anticipated by approximately $\pi/2$).

In the example of FIG. 2C, phase shifter 206 produces signal 220. In this example, signal 220 is $\pi/2$-out-of-phase relative to clock signal 218. As a result, the edges of signal 220 are aligned with the peaks of signal 216. It should be appreciated that, in some of the embodiments in which the carrier signal varies in time according to a sinusoidal function, the peaks of signal 216 may fall at the midpoint between two consecutive zeros. As such, shifting the phase of the clock signal by approximately $\pi/2$ may ensure that the input signal is sampled in correspondence with (or near) its peaks.

In some embodiments, the phase shifted clock signal may be used to trigger sampler 210. That is, sampler 210 may sample the amplitude-modulated signal in correspondence with the edges (e.g., the falling edges) of the phase-shifted clock signal. As a result, the sampled signal may exhibit an amplitude that is equal to, or at least substantially equal to (e.g., within 99%, 95%, 90%, 85%, 80%, or 75%) the peaks of the amplitude-modulated signal. In the example of FIG. 2C, sampled signal 222 tracks the envelope of signal 216.

In some embodiments, the sampled signal is converted into the digital domain using ADC 212, as shown in FIG. 2A.

Figure 3:
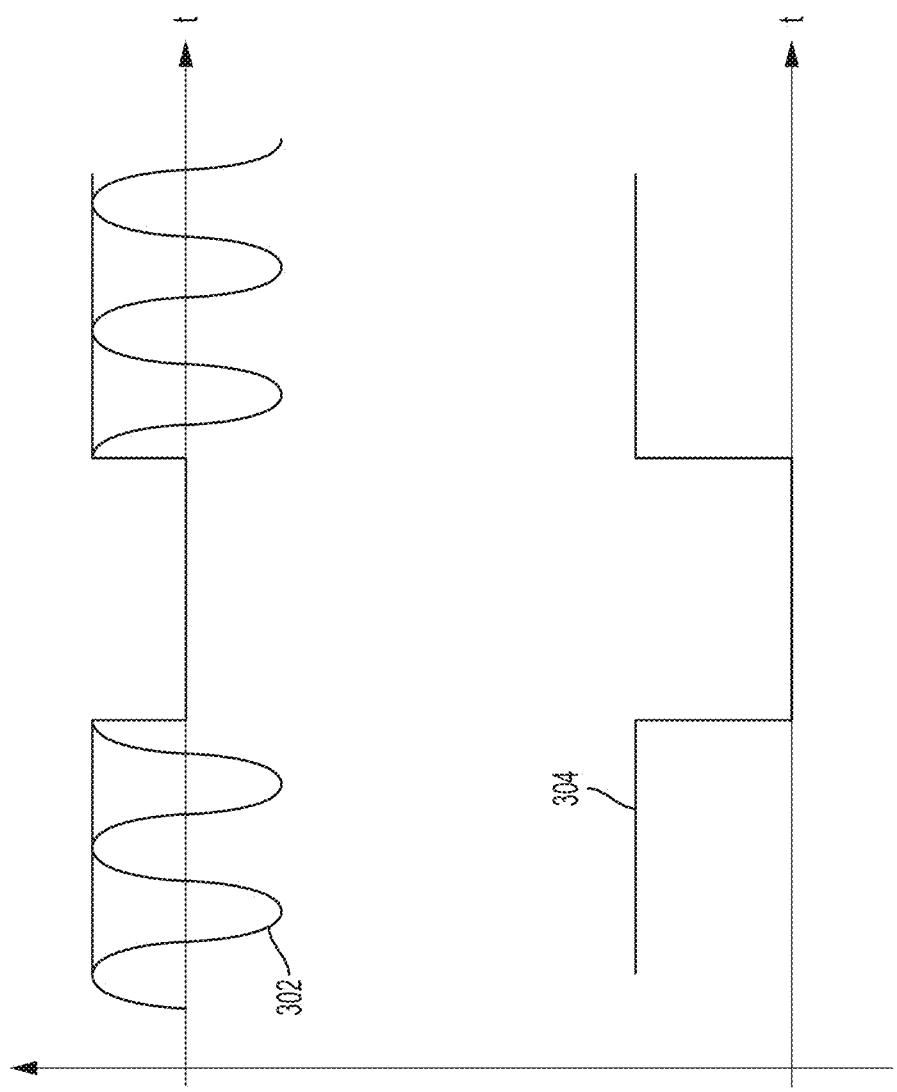
FIG. 3 is a plot illustrating an input signal having a 100%-modulation depth, according to some non-limiting embodiments.

Modulation techniques of the types described herein may be used regardless of the modulation depth being used. The inventors have appreciated that, in some circumstances, it may be desirable to use modulation depths that are equal to, or at least close to, 100%. As such, the amplitude of the modulated signal in correspondence to a logic 0 is substantially zero (e.g., less than 100 mV, less than 10 mV, less than 1 mV, or less than 10007, or less than 1000 for the duration of the symbol. This case is illustrated in the example of FIG. 3. Signal 302 is obtained by modulating a carrier signal with the baseband signal 304. As shown, in correspondence with a logic 0, the amplitude of signal 302 is substantially zero. In this circumstance, generation of the clock signal as described above may be impaired by the absence of a time reference, since the amplitude is substantially zero for an extended duration (e.g., for one or more cycles of the input signal, a cycle being defined as the inverse of the carrier frequency of the input signal).

To that end, some embodiments of the present application are directed to circuits for demodulating signals with large modulation depths. For example, some embodiments include locking oscillators (e.g., a phase locked loop or just a voltage-controlled locking oscillator) configured to provide an oscillating signal (e.g., a clock) even when the amplitude-modulated signal is substantially zero.

One such circuit is illustrated in FIG. 4A. Relative to the demodulator of FIG. 2A, locking oscillator 208 is included. Locking oscillator 208 may implemented, for example, as a phased-locked loop (PLL) in some embodiments. Locking oscillator 208 may be implemented as a locked voltage-controlled oscillator in some embodiments. Locking oscillator 208 may be configured to support modulation depths as high as 100%. While locking oscillator 208 is illustrated as being disposed between clock extractor 204 and phase shifter 206, other arrangements are also possible. For example, a locking oscillator may be disposed between phase shifter 206 and sampler 210.

The plot of FIG. 4B illustrates how the demodulator of FIG. 4A may operate, at least in some embodiments. Amplitude-modulated signal 416 is modulated with a modulation depth of 100%. As a result, it exhibits an amplitude equal to zero between t1 and t2. Accordingly, during this period, clock signal 418 ceases to oscillate. The clock signal 418 is may be provided as input to the locking oscillator, which may in response lock to the frequency of clock signal 418 exhibited prior to t1. As a result, signal 419 may continue to oscillate even when the amplitude of signal 416 is equal to zero. As such, locking oscillator 208 may bridge the oscillation across the periods in which the amplitude of the input signal is substantially zero. It should be appreciate that circuits other than a voltage-controlled locking oscillator may be used to perform the bridging function in some embodiments. Signal 420 may be obtained by phase-shifting signal 419 as described above, and signal 422 may be obtained by sampling signal 416 with signal 420.

Some of the embodiments described above may be configured to sample only the positive peaks (or alternatively, the negative peaks) of the input signal. In other embodiments, both the positive and the negative peaks may be sampled. In this way, a differential signal is obtained and the signal-to-noise ratio may be improved.

Figure 5A:
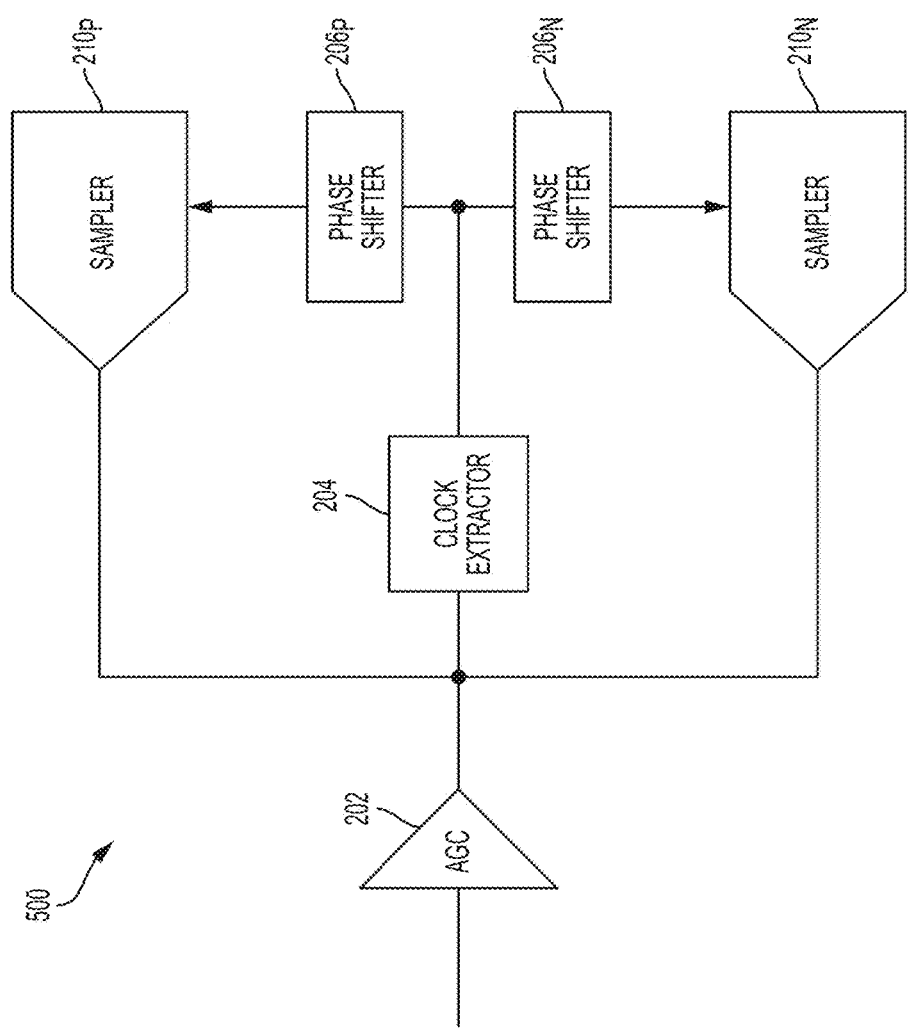
FIG. 5A is a block diagram of a demodulator including, among other components, a pair of phase shifters, according to some non-limiting embodiments.
Figure 5B:
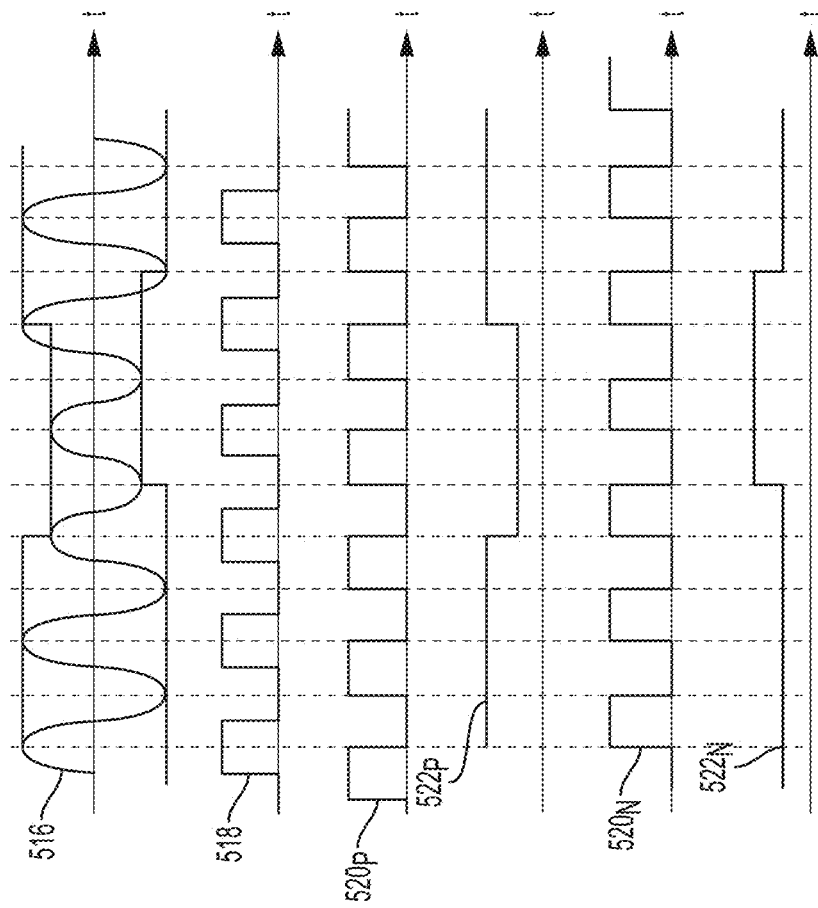
FIG. 5B is a plot illustrating an input signal, a clock signal, a pair of phase-shifted signals, and a pair of output signals, according to some non-limiting embodiments.

A representative demodulator for sampling positive and negative peaks is illustrated in FIG. 5A. Demodulator 500 may include AGC 202, clock extractor 204, phase shifters $206_N$ and $206_P$, and samplers $210_N$ and $210_P$. The signals appearing in the demodulator of FIG. 5A are illustrated in the example of FIG. 5B. Signal 516 may be an amplitude-modulated signal having any suitable modulation depth. Signal 518 may be generated using clock extractor 204 as described above. Signals $520_P$ and $520_N$ may be generated using phase shifters $206_P$ and $206_N$, respectively. In some embodiments, the two phase shifters may introduce phase shifts that are opposite in sign with respect to each other. For example, phase shifter $206_P$ may shift the phase of signal 518 by approximately $n\pi/2$, and phase shifter $206_N$ may shift the phase of signal 518 by approximately $m\pi/2$, where n and m are odd integers having opposite signs. In this manner, the falling edges (or alternatively the rising edges) of signal $520_P$ are substantially aligned with the positive peaks of signal 516, and the falling edges (or alternatively the rising edges) of signal $520_N$ are substantially aligned with the negative peaks of signal 516. Signals $522_P$ and $522_N$, which may collectively form a differential signal, are thus obtained.

In some embodiments, sampling positive and negative peaks may be accomplished by doubling the frequency of the sampling signal relative to the case in which only one type of peaks (the positive or the negative) are sampled.

Various aspects of the apparatus and techniques described herein may be used alone, in combination, or in a variety of arrangements not specifically discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including", "comprising", "having", "containing" or "involving" and variations thereof herein, is meant to encompass the items listed thereafter and equivalents thereof as well as additional items.

The use of "coupled" or "connected" is meant to refer to circuit elements, or signals, that are either directly linked to one another or through intermediate components.

What is claimed is:

1. An amplitude demodulator comprising:
   a clock extractor configured to extract a clock signal from an input signal;
   a phase shifter configured to generate a sampling signal by phase-shifting the clock signal by approximately $\pm n\pi/2$ wherein n is an odd integer;
   a sampler configured to sample the input signal with a timing controlled by the sampling signal; and
   an analog-to-digital converter (ADC) coupled to an output of the sampler.

2. The amplitude demodulator of claim 1, wherein the phase shifter is configured to generate the sampling signal by phase-shifting the clock signal by $\pm n\pi/2$.

3. The amplitude demodulator of claim 1, wherein the input signal is received from a wireless channel through a winding.

4. The amplitude demodulator of claim 3, wherein the input signal is modulated at a carrier frequency of 13.56 MHz±7 KHz.

5. The amplitude demodulator of claim 1, further comprising a voltage-controlled locking oscillator coupled to the clock extractor.

6. The amplitude demodulator of claim 5, wherein the voltage-controlled locking oscillator is configured to lock to a frequency of the clock signal.

7. The amplitude demodulator of claim 1, wherein the clock extractor comprises a threshold circuit.

8. The amplitude demodulator of claim 1, wherein the phase shifter is a first phase shifter, the sampling signal is a first sampling signal, the timing is a first timing and the sampler is a first sampler, and further comprising a second phase shifter and a second sampler,
 wherein the second phase shifter is configured to generate a second sampling signal by phase-shifting the clock signal by approximately $\pm m\pi/2$ wherein m is an odd integer and wherein n and m have opposite signs, and the sampler is configured to sample the input signal with a second timing controlled by the second sampling signal.

9. The amplitude demodulator of claim 1, further comprising an automatic gain control (AGC) unit coupled to the clock extractor.

10. A method for demodulating an input signal, the method comprising:
 extracting a clock signal from an input signal;
 generating a sampling signal by phase-shifting the clock signal by approximately $\pm n\pi/2$ wherein n is an odd integer;
 sampling the input signal with a timing controlled by the sampling signal; and
 digitizing the sampled input signal with an analog-to-digital converter (ADC).

11. The method of claim 10, wherein the input signal is received wirelessly.

12. The method of claim 11, wherein the input signal is received through a winding.

13. The method of claim 10, wherein extracting the clock signal from the input signal comprises generating a first value when the input signal is greater than a threshold and generating a second value when the input signal is less than a threshold.

14. The method of claim 10, wherein phase-shifting the clock signal by approximately $\pm n\pi/2$ comprises phase-shifting the clock signal by $\pm n\pi/2$.

15. The method of claim 10, further comprising locking to a frequency of the clock signal and generating a locked signal having the frequency of the clock signal.

16. The method of claim 15, further comprising sampling the input signal with the locked signal when an amplitude of the input signal is substantially zero throughout at least one cycle.

17. The method of claim 15, wherein the frequency of the clock signal is 13.56 MHz±7 KHz.

18. The method of claim 10, wherein the sampling signal is a first sampling signal and the timing is a first timing, and further comprising:
 generating a second sampling signal by phase-shifting the clock signal by approximately $\pm m\pi/2$ wherein m is an odd integer and wherein n and m have opposite signs; and
 sampling the input signal with a second timing that is controlled by the second sampling signal.

* * * * *